(12) United States Patent
Yeh et al.

(10) Patent No.: US 6,291,898 B1
(45) Date of Patent: *Sep. 18, 2001

(54) BALL GRID ARRAY PACKAGE

(75) Inventors: Yung I Yeh; Te Tsung Chao; Ya Ping Hung; Hui Chin Fang, all of Kaohsiung (TW)

(73) Assignee: Advanced Semiconductor Engineering, Inc., Kaoshiung (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/534,984

(22) Filed: Mar. 27, 2000

(51) Int. Cl.$^7$ .......................... H01L 23/48; H01L 23/50; H01L 29/40
(52) U.S. Cl. .......................... 257/786; 257/773; 257/690; 257/691; 257/692; 257/784; 257/780; 257/782; 361/772; 361/802
(58) Field of Search .......................... 257/780–786, 257/692, 698, 690.691, 773; 438/612, 616; 361/772, 802

(56) References Cited

U.S. PATENT DOCUMENTS 5,468,999    11/1995   Lin et al. .
5,502,278 *  3/1996    Mabboux et al. ................... 174/52.4
5,962,926 * 10/1999    Torres et al. .......................... 257/786
6,034,427 *  3/2000    Lan et al. .............................. 257/698
6,037,669 *  3/2000    Shu et al. .............................. 257/786

FOREIGN PATENT DOCUMENTS

405029546 * 2/1993 (JP) .......................................... 27/4

* cited by examiner

Primary Examiner—Steven Loke
Assistant Examiner—Nitin Parekh
(74) Attorney, Agent, or Firm—Stevens, Davis, Miller & Mosher, LLP

(57) ABSTRACT

A BGA package includes a chip with an array pad design disposed on the upper surface of a substrate. The chip has a plurality of bonding pads located about the periphery thereof, and the bonding pads of the chip are positioned in three rows, an inner row, a middle row, and an outer row along the sides of the chip. Only power supply pads and ground pads are designed to be located in the outer row of bonding pads, and all of the I/O pads are designed to be located in the middle row of the bonding pads and the inner row of the bonding pads. The outer row, middle row, and the inner row of the bonding pads are electrically connected to the substrate through three tiers of bonding wires with different loop height, respectively,

9 Claims, 3 Drawing Sheets

BALL GRID ARRAY PACKAGE

BACKGROUND OF THE INVENTION

1. Field of the Invention

This invention generally relates to a ball grid array (BGA) package, and more particularly to a BGA package using a wire bonding technique.

2. Description of the Related Art

As electronic devices have become more smaller and thinner, the speed and the complexity of the IC chip have increased. Accordingly, a need has arisen for higher package efficiency. To meet the need, the ball grid array (BGA) technology has been developed by the semiconductor industry.

Although the conductive traces pads on a BGA substrate can be lithographically defined to achieve a very fine pitch, the bond pad pitch on the semiconductor die is typically restricted from achieving a comparable pitch due to spacing and design rules used to account for wire bonding methods and tolerances, such as capillary tool interference during wire bonding.

Conventional IC bond pad designs include (a) single in-line bond pad design and (b) staggered bond pad design. Typically, the number of connections to external circuit elements, commonly referred to as "input-output" or "I/O" connections, is determined by the structure and function of the chip. Advanced chips capable of performing numerous functions may require a substantial number of I/O connections. For high I/O count IC chips, the staggered bond pad design has been used so as to increase the maximum allowable pad number that can be designed on a chip. This has the benefit of providing not only more bonding pads per chip, but also shorter metal wires and thus faster circuits.

FIG. 1 shows a conventional plastic BGA package 100 comprising a chip 110 with a staggered bond pad design disposed on the upper surface of a substrate 120. The chip 110 and a portion of the upper surface of the substrate 120 are encapsulated in a package body 150. The upper surface of the substrate 120 is provided with a ground ring 122, a power ring 124, and a plurality of conductive traces 126 (see FIG. 2). The active surface of the chip 110 is provided with a plurality of the bonding pads 112 positioned in two rows. The bonding pads 112 on the chip 110 typically include power pads, ground pads and I/O pads. The power pads are used for supplying the source voltage. The ground pads are used for supplying the ground potential.

Typically, the number of the I/O pads accounts for about two-thirds of the total number of the bonding pads 112. Thus, at least some of the outer row of bonding pads 112 must be designed as I/O pads. The outer row of bonding pads 112 is referred to as bonding pads closest to the sides of the chip. Therefore, at least four tiers of bonding wires with different loop heights are required for avoiding short circuiting, wherein the bonding wires electrically connect the chip 110 to the substrate 120. The first tier bonding wires 112a (lowest loop height) connect the ground pads designed in the outer row of the bonding pads to the ground ring 122 of the substrate 120. The second tier bonding wires 112b connect the power pads designed in the outer row of the bonding pads to the power ring 124 of the substrate 120. The third tier bonding wires 112c connect the I/O pads designed in the outer row of the bonding pads to corresponding conductive traces 126 of the substrate 120. The fourth tier bonding wires 112d connect the I/O pads designed in the inner row of the bonding pads to corresponding conductive traces 126 of the substrate 120. The wire bonding parameters of each tier must be optimized separately. Therefore, the four tiers of bonding wires 112a, 112b, 112c, 112d require at least four times of wire bonding operations. Difficulty and risks of wire bonding are proportional to the number of wire bonding operations required.

It has been revealed that using an array of pads instead of using only perimeter pads can increase the maximum allowable pad number that can be designed on a chip. However, this will greatly increase the difficulty of wire bonding as described above.

SUMMARY OF THE INVENTION

It is a primary object of the present invention to provide a BGA package which significantly increases the maximum allowable pad number that can be designed on a chip without increasing the tiers of bonding wires, thereby decreeing the difficulty of wire bonding.

The BGA package in accordance with the present invention comprises a chip with an array pad design disposed on the upper surface of a substrate. The chip has a plurality of bonding pads located about the periphery thereof. The bonding pads of the chip are positioned in three rows: an inner row, a middle row, and an outer row along the sides of the chip. Only power supply pads and ground pads are designed in the outer row of bonding pads. All of the I/O pads are designed in the middle row of the bonding pads and the inner row of the bonding pads. The upper surface of the substrate is provided with a ground ring, a power ring, and a plurality of conductive traces.

Therefore, only three tiers of bonding wires with different loop height are required for avoiding short circuiting wherein the bonding wires electrically connect the chip to the substrate. The lower tier bonding wires connect the ground pads/power supply pads designed in the outer row of the bonding pads to the ground ring/power ring of the substrate. The middle tier bonding wires connect the I/O pads designed in the middle row of the bonding pads to corresponding conductive traces of the substrate. The upper tier bonding wires connect the I/O pads designed in the inner row of the bonding pads to corresponding conductive traces of the substrate. Therefore, the three tiers of bonding wires only require three separate wire bonding operations.

Accordingly, BGA package of the present invention can significantly increase the maximum allowable pad number that can be designed on a chip without increasing the tiers of bonding wires thereby decreasing the difficulty of wire bonding.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENTS

Figure 1:
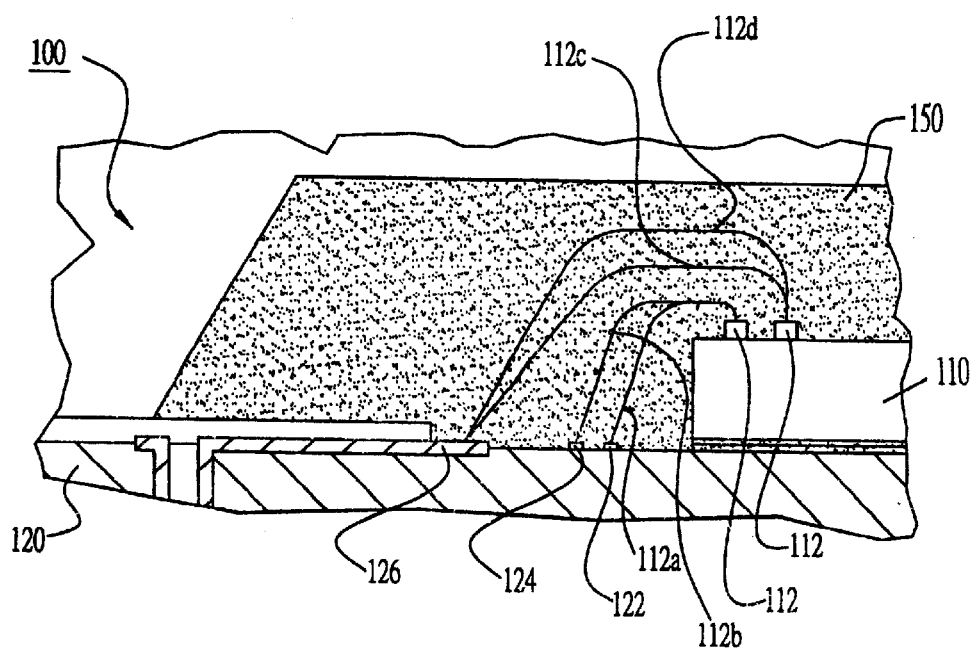
FIG. 1 is a cross sectional view of a portion of a conventional BGA package.
Figure 2:
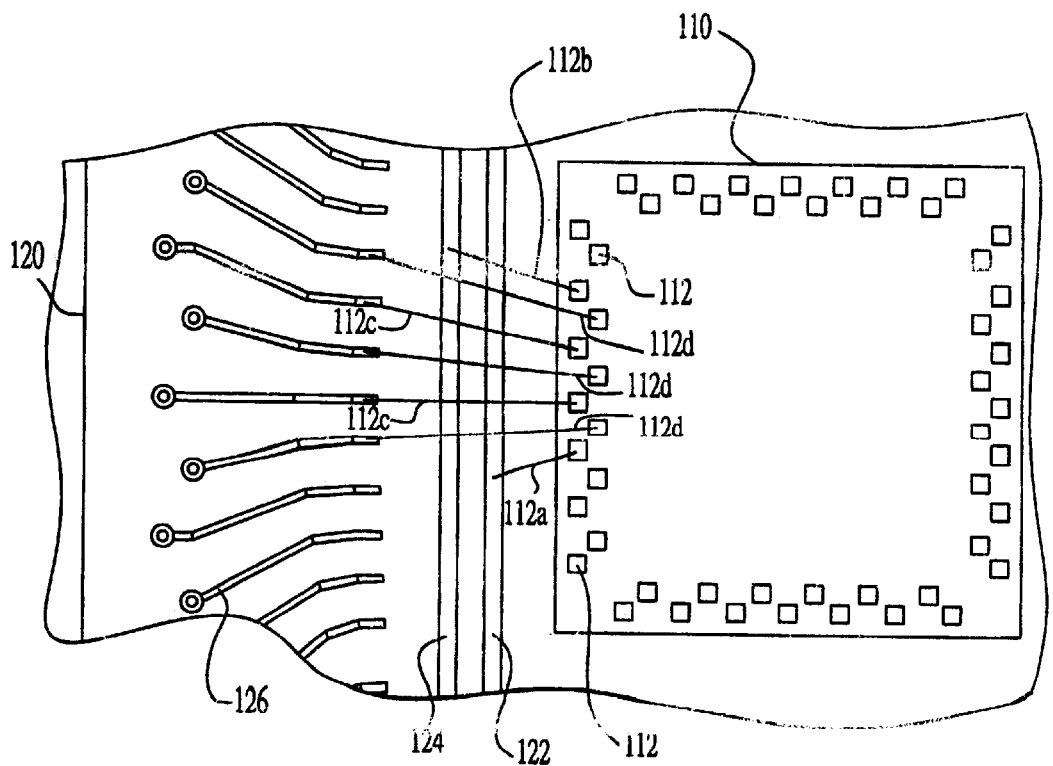
FIG. 2 is a top plan view of the package of FIG. 1 wherein the package body has been removed.
Figure 3:
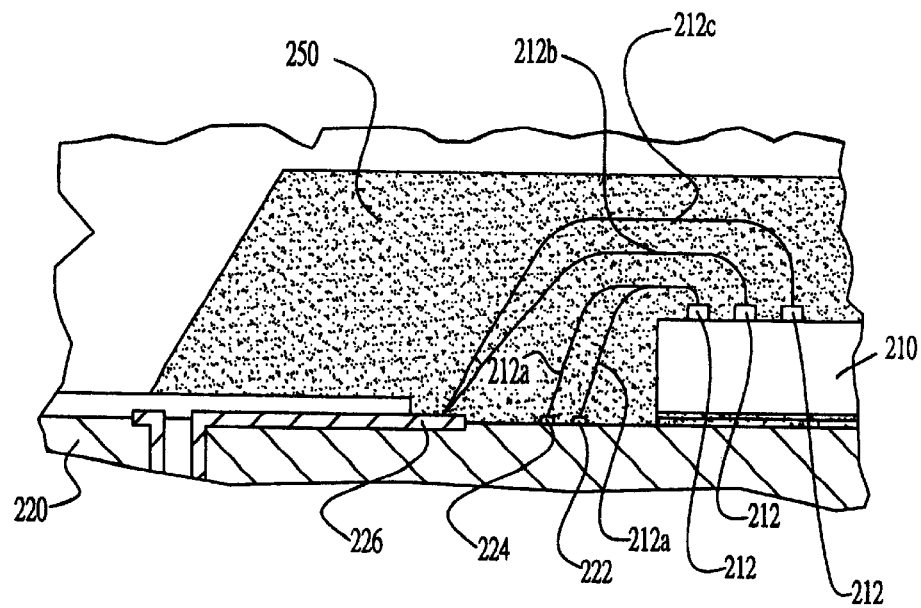
FIG. 3 is a cross sectional view of a portion of a BGA package according to a first preferred embodiment of the present invention.

FIG. 3 shows a portion of a BGA package 200 according to a first preferred embodiment of the present invention. The BGA package 200 comprises a chip 210 with an array pad design (see FIG. 4) disposed on the upper surface of a substrate 220. The chip 210 and a portion of the upper surface of the substrate 220 are encapsulated in a package body 250.

Figure 4:
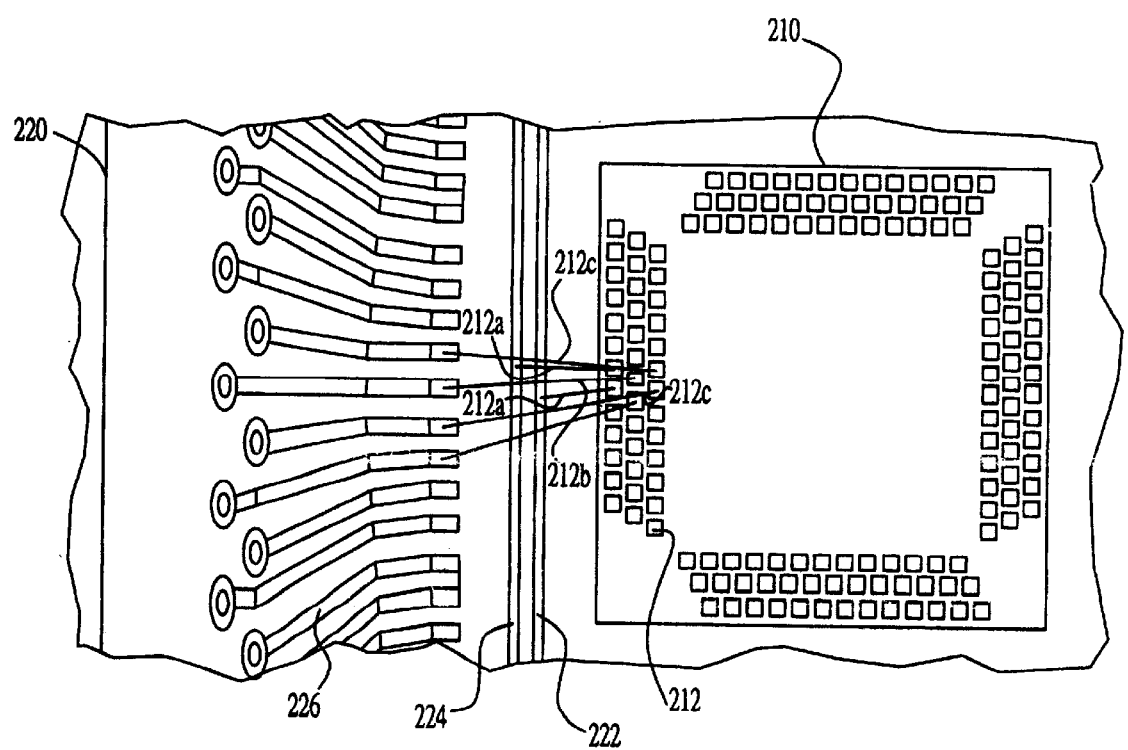
FIG. 4 is a top plan view of the package of FIG. 3 wherein the package body has been removed.

Referring to FIG. 4, the upper surface of the substrate 220 is provided with a ground ring 222, a power ring 224, and a plurality of conductive traces 226 arranged at the periphery of the ground ring 222 and the power ring 224. The lower surface of the substrate 220 is provided with a plurality of solder pads (not shown) electrically connected to the ground ring, the power ring, and the conductive traces, respectively. Each solder pad is provided with a solder ball for making external electrical connection. The chip 210 has a plurality of bonding pads 212 formed on the active surface thereof and located about the periphery thereof. The bonding pads 212 are positioned in three rows: an inner row, a middle row, and an outer row along the sides of the chip 210. The outer row of bonding pads 112 is closer to the sides of the chip 210 than other rows. Typically, the number of the I/O pads accounts for about two thirds of the total number of the bonding pads 212. Thus, in the first preferred embodiment, all of the I/O pads are designed in the middle row of the bonding pads and the inner row of the bonding pads. Only power supply pads and ground pads are designed in the outer row of bonding pads 212. Preferably, the outer row of the bonding pads 212, the middle row of the bonding pads 212, and the inner row of the bonding pads 212 are staggered with respect to one another along the sides of the chip.

Referring to FIG. 3 and FIG. 4, the lower tier bonding wires 212a connect the ground pads/power supply pads designed in the outer row of the bonding pads to the ground ring 222/power ring 224 of the substrate 220. All bonding wires 212a of the lower tier substantially have the same loop height. The middle tier bonding wires 212b connects the I/O pads designed in the middle row of the bonding pads to corresponding conductive traces 226 of the substrate 220. All bonding wire 212b of the middle tier have substantially have the same loop height. The upper tier bonding wires 212c connect the I/O pads designed in the inner row of the bonding pads to corresponding conductive traces 226 of the substrate. All bonding wire 212c of the upper tier have substantially have the same loop height. Since the loop height of each tier (lower, middle, upper) is different from one another, there is no need to consider the horizontal wire pitch between different tier bonding wires, thereby increasing flexibility in designing the layout of the conductive traces on substrate. Moreover, the three tiers of bonding wires require only three separate wire bonding operations.

Figure 5:
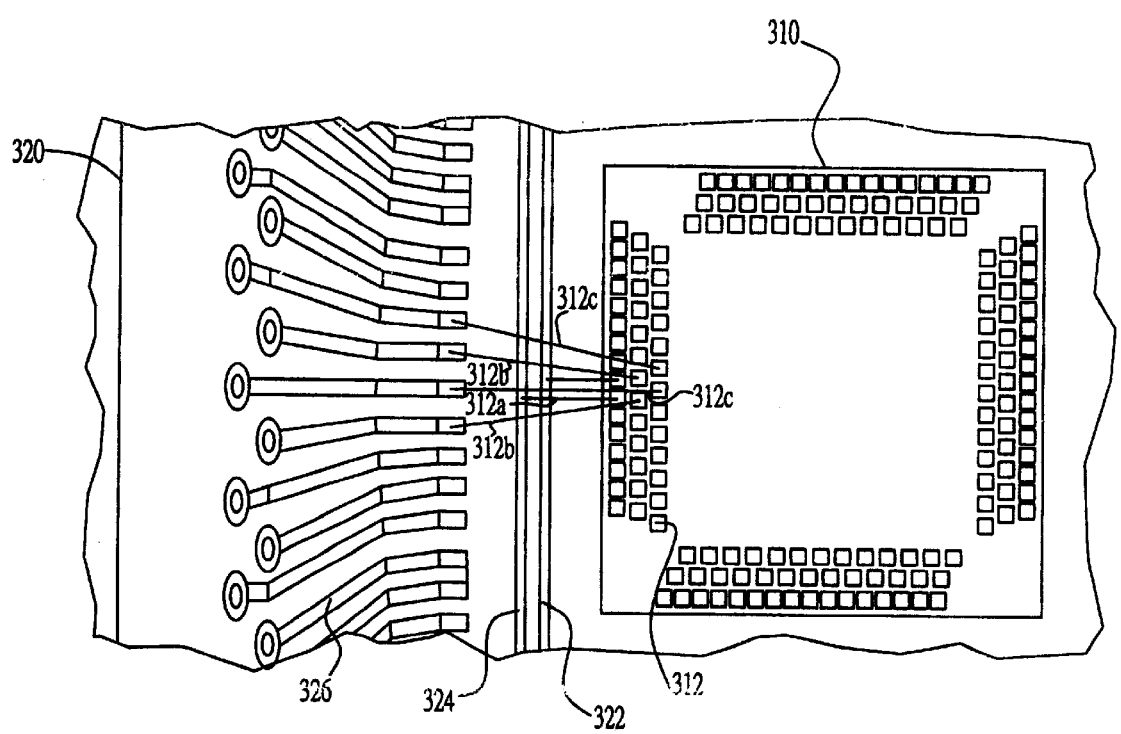
FIG. 5 is a top plan view of a portion of a BGA package according to a second preferred embodiment of the present invention wherein the package body has been removed.

FIG. 5 discloses a portion of a BGA package 300 according to a second preferred embodiment of the present invention. The BGA package 300 is substantially identical to the BGA package 200 of FIG. 4 with the exception that the bond pad pitch of the outer row of the bonding pads is smaller than that of the middle row of the bonding pads and the inner row of the bonding pads on chip 310, and each bonding wire 312a of the lower tier is bonded to be approximately orthogonal to one side of the chip 310. The lower tier bonding wires 312a is used for connecting the ground pads/power supply pads designed in the outer row of the bonding pads to the ground ring 322/power ring 324 of the substrate 320. Since the lower tier bonding wires 312a are bonded to be approximately orthogonal to one side of the chip 310, there is no need to consider the horizontal wire pitch between the lower tier bonding wires 312a. Therefore, the bond pad pitch of the outer row of the bonding pads can be designed to be smaller than that of the middle row of the bonding pads and the inner row of the bonding pads on chip 310, while still using a common tip of capillary to perform the wire bonding operation.

Thus, in the BGA package 300 according to a second preferred embodiment, the bond pad pitch of the outer row of the bonding pads can be designed to be more compact while still using the tip of capillary of the same size to perform the wire bonding operation. It should be noted that the bond pad pitch of the outer row of the bonding pads can be diminished to about 75% of that of the middle row of the bonding pads, and the inner row of the bonding pads while still capable of using a common tip of capillary to perform the wire bonding operation of all bonding pads including the outer, middle, and inner rows. Moreover, in the second preferred embodiment, while each bonding wire 312a of the lower tier is preferably bonded to be approximately orthogonal to one side of the chip 310, slight variations in the bonding direction (for example, plus or minus 30°) are still allowable for wire bonding operation.

The BGA packages in accordance with the present invention utilize a chip with an array pad design to significantly increase the maximum allowable pad n Alder that can be designed on a chip. Therefore, in the present invention all power pads and ground pads are designed in the outer row of the bonding pads in order to decrease the tiers of bonding wires, thereby decreasing the difficulty of wire bonding. Further, increasing the maximum allowable pad number has the benefit of providing not only more bonding pads per chip, but also shorter metal wires, and thus faster circuits.

Although the invention has been explained in relation to its preferred embodiments, it is to be understood that many other possible modifications and variations can be made without departing from the spirit and scope of the invention as hereinafter claimed.

What is claimed is:

1. A ball grid array package comprising:
    a substrate having opposing upper and lower surfaces, the upper surface of the substrate being provided with a ground ring, a power ring, and a plurality of conductive traces arranged at the periphery of the ground ring and the power ring, and the lower surface of the substrate being provided with a plurality of solder pads electrically connected to the ground ring, the power ring, and the conductive traces;
    a semiconductor chip disposed on the upper surface of the substrate, the chip having a plurality of bonding pads located about the periphery of the chip;
    the bonding pads of the chip being positioned in first, second, and third rows, the first, second, and third rows comprising, respectively, an inner row, a middle row, and an outer row along the sides of the chip, wherein the outer row of bonding pads consists of power supply pads and ground pads;
    a plurality of first bonding wires, wherein all of the outer row of bonding pads of the chip are respectively coupled to the power ring or the around ring of the substrate via the plurality of first bonding wires wherein each of the first bonding wires has a loop height of substantially the same value and is bonded to be approximately orthogonal to one side of the chip;
    a plurality of second bonding wires electrically connecting the middle row of bonding pads of the chip to corresponding conductive traces of the substrate, respectively, wherein each of the second bonding wires has a loop height of substantially the same value;

a plurality of third bonding wires electrically connecting the inner row of bonding pads of the chip to corresponding conductive traces of the substrate, respectively, wherein each of the third bonding wires has a loop height of substantially the same value; and a package body formed over the semiconductor chip, the bonding wires and the upper surface of the substrate.

2. The ball grid array package as claimed in claim 1, further comprising a plurality of solder balls mounted to the solder pads of the substrate.

3. The ball grid array package as claimed in claim 1, wherein the outer row of the bonding pads, the middle row of the bonding pads, and the inner row of the bonding pads are staggered with respect to one another along the sides of the chip.

4. The ball grid array package as claimed in claim 1, wherein the bond pad pitch of the outer row of the bonding pads is smaller than the bond pad pitch of the middle row of the bonding pads and the inner row of the bonding pads.

5. The ball grid array package as claimed in claim 4, wherein the bond pad pitch of the outer row of the bonding pad is at least about 75% of the bond pad pitch of the middle row of the bonding pads and the inner row of the bonding pads.

6. A semiconductor chip comprising a plurality of bonding pads located about the periphery of the chip in an array arrangement, wherein the bonding pads are positioned in first, second, and third rows, the first, second, and third rows comprising respectively an inner row, a middle row, and an outer row along the sides of the chip, wherein the outer row of bonding pads consists of power supply pads and ground pads.

7. The semiconductor chip as claimed in claim 6, wherein the outer row of the bonding pads, the middle row of the bonding pads, and the inner row of the bonding pads are staggered with respect to one another along the sides of the chip.

8. The semiconductor chip as claimed in claim 6, wherein the bond pad pitch of the outer row of the bonding pads is smaller than the bond pad pitch of the middle row of the bonding pads and the inner row of the bonding pads.

9. The semiconductor chip as claimed in claim 8, wherein the bond pad pitch of the outer row of the bonding pads is at least about 75% of the bond pad pitch of the middle row of the bonding pads and the inner row of the bonding pads.

* * * * *